United States Patent
Parry et al.

[11] Patent Number: 6,088,225
[45] Date of Patent: Jul. 11, 2000

[54] CABINET WITH ENHANCED CONVECTION COOLING

[75] Inventors: Mark James Parry, Herts; Peter John Dyke, Saffron Waldon, both of United Kingdom

[73] Assignee: Northern Telecom Limited, Montreal, Canada

[21] Appl. No.: 09/042,952

[22] Filed: Mar. 17, 1998

[51] Int. Cl.[7] ...................................................... H05K 7/20
[52] U.S. Cl. .......................... 361/704; 361/687; 361/688; 361/689; 361/690; 361/692; 361/707; 165/80.3; 165/185; 165/104.33; 174/16.1; 174/16.3; 454/184; 312/223.2
[58] Field of Search ...................................... 361/676, 678, 361/690, 695, 704, 714, 715, 716, 721, 754, 756; 174/16.1, 16.3; 165/80.3, 185; 312/223.2; 454/184

[56] References Cited

U.S. PATENT DOCUMENTS

| | | | |
|---|---|---|---|
| 3,369,597 | 2/1968 | Dronsuth et al. | 165/80.3 |
| 3,900,700 | 8/1975 | Gaudet | 174/16 R |
| 4,263,963 | 4/1981 | Ghiraldi | 361/704 |
| 5,040,095 | 8/1991 | Beaty et al. | 361/694 |
| 5,150,278 | 9/1992 | Lynes et al. | 361/690 |
| 5,812,373 | 9/1998 | Hwang | 361/704 |

FOREIGN PATENT DOCUMENTS 2 312 099  10/1997  United Kingdom .

*Primary Examiner*—Leo P. Picard
*Assistant Examiner*—Boris L. Chervinsky
*Attorney, Agent, or Firm*—Lee, Mann, Smith, McWilliams, Sweeney & Ohlson

[57] ABSTRACT

A cabinet for outdoor use for enclosing a rack of electronics equipment has a double skin protective outer casing comprising a lower air intake into a cavity between the skins of the double skin and an upper air output from the cavity to the outside, for unforced cooling air to flow, to extract heat from the equipment by convection. The inner of the skins is formed in part at least by a heat sink of the rack. This unites the thermal management of the rack and that of the enclosure to provide an improved thermal path from the cards in the rack to the cold wall. This means the temperature difference between the inner skin and the air in the cavity can be increased for a given card temperature, so more heat can be extracted. The heat sink may share the back wall of the rack with the motherboard.

15 Claims, 6 Drawing Sheets

SECTION A-A

SECTION A-A

CABINET WITH ENHANCED CONVECTION COOLING

BACKGROUND TO THE INVENTION

1. Field of the Invention

The invention relates to cabinets for outdoor use for enclosing racks of electronics equipment, and to methods of manufacturing such cabinets.

2. Background Art

It is known to provide outdoor cabinets for communications equipment such as racks of cards holding electronic or optical components. Such cabinets are provided at outdoor locations where there is no suitable existing building to hold the equipment and protect it from adverse environmental conditions, and where the size of the equipment is too small to justify a dedicated building. Examples of such cabinets include roadside cabinets for housing electronics for controlling traffic signals, or cabinets for cellular radio network base station electronics.

Some of the principal considerations in the design of such cabinets include: level of environmental protection, corrosion resistance, strength to cost ratio, thermal management, public safety, aesthetic considerations, vulnerability to vandalism, ease of installation, ease of access to equipment, and level of electromagnetic shielding. The issue of thermal management will be discussed in more detail.

The main thermal effects are as follows. The equipment inside the enclosure generates heat which may need to be extracted. The enclosure may be subject to external sources of heat, such as solar radiation.

A common constraint in the design is that the equipment should not have ambient air passing over electronic components, to avoid deterioration from contaminants and corrosives in the ambient air. Thus the equipment may be sealed within the enclosure, and heat from components within the sealed part may be conducted to the outside of the sealed part, and the sealed part cooled by fans circulating ambient air. A heat exchanger may be used if further cooling is required. In extreme cases, air conditioning may be appropriate.

It is known to provide a cabinet with a single metal skin for the sides. This can provide sufficient strength and weatherproofing, to resist wind and rain. It offers little resistance to solar radiation, even if painted a light colour or silvered to reduce heat absorption.

It is also known from U.S. Pat. No. 4,535,386 to provide a sealed enclosure for electronic components such as silicon controlled rectifiers, using a single metal skin, but enhancing the natural convection past heat sinks mounted to protrude through the skin, by providing an outer chimney surrounding the heat sinks to duct cool air past the sinks and improve dissipation. However this disclosure is not concerned with a cabinet for outdoor use.

The provision of a double skin for the sides of the enclosure is also known, which assists in cooling the equipment by the "cold wall cooling" principle. A chimney effect is produced in the cavity between the skins. An inlet at the bottom of the cavity allows air in, to flow up the cavity and out of an outlet at the top of the cavity. Heat from the internal skin is thus extracted from the cabinet by convection, and thus the equipment inside the cabinet can be kept cool. Furthermore, heat from solar radiation on the external skin can also be extracted, and prevented from reaching the equipment inside.

Where the internal equipment is producing more heat than can be handled by natural convection in the double skin, it is known to provide fans at the top of the cavity to draw air through the cavity and thus increase the rate of heat extraction. If this is still insufficient, an air to air heat exchanger could be provided, or an air conditioning unit might be considered to take the air within the enclosure and return it to the enclosure at a lower temperature.

It is appreciated that such active cooling measures may reduce the reliability of the cabinet, or increase it's maintenance costs, and will certainly increase it's production cost. Accordingly thermal and fan management systems are used to minimise the amount of time the active cooling measures are used, to maximise the life expectancy of fans and associated filters.

SUMMARY OF THE INVENTION

It is an object of the invention to provide improved methods and apparatus.

According to a first aspect of the invention there is provided a cabinet for outdoor use for enclosing a rack of electronics equipment, the cabinet comprising:

a double skin protective outer casing for enclosing the equipment, the casing comprising:
  a lower air intake into a cavity between the skins of the double skin of the casing and an upper air output from the cavity to the outside, defining a path for unforced cooling air to flow, to extract heat from the equipment by convection; and
  the inner of the skins being formed in part at least by a heat sink of the rack.

One of the advantages arising from this is that the thermal path from the cards in the rack to the cold wall is improved. This means the temperature difference between the inner skin and the air in the cavity can be increased for a given card temperature, so more heat can be extracted. This unites the thermal management of the rack and that of the enclosure in a way which has not been conceived before, and can achieve better natural convection cooling than previous attempts which have focused on improving the thermal performance of individual parts of the system.

Preferably, the heat sink forms at least part of a back wall of the rack, against which cards are inserted. This carries the advantage that the heat sink can contact all the cards in the rack, thus components generating heat can be mounted on any of the cards. Furthermore, the heat sink can be oriented to be vertical for good convection, while the open front of the rack can face the doors of the cabinet for easy access to slide cards in or out of the rack.

Preferably, the heat sink shares the same wall of the rack as a backplane comprising connectors for connecting signals to the cards. An advantage of this is that it enables the above mentioned thermal advantages to be achieved with few alterations to prior art racks oriented for horizontal insertion of cards, to couple with connectors on a backplane at the back of the rack. The backplane is thus oriented vertically, which is the preferred orientation for the heat sink, for good convection flow.

Preferably, the rack is arranged such that substantially the entire back wall forms the heat sink, the rack comprising:

guides for guiding cards inserted into the rack along an insertion axis, normal to the back wall and enabling subsequent movement of the cards after insertion, along a connection axis, perpendicular to the insertion axis; and a backplane, comprising connectors for coupling to corresponding connectors on the cards, oriented perpendicular to the back wall and located to enable the coupling to take place by the subsequent movement of the cards along the connection axis. An advantage arising is that a better thermal path can be created if the entire back wall is used for the heat sink. Furthermore, a conventional backplane can then be used, without modification to accommodate heat sinks. Another advantage arising is that the heat sink can be oriented vertically for good convection flow, and the insertion axis can be horizontal, to enable easy access from a door in the wall of the cabinet for example.

Preferably, the rack further comprises a mechanism for urging cards individually along the connection axis after insertion.

Preferably, the back wall further comprises:
a thermally conductive contact surface for abutting a corresponding surface on one of the cards, extending along substantially the entire leading edge of each card, for making thermally conductive contact with a card inserted in the rack. An advantage of this is that it helps improve the thermal path from the card to the cavity, and thus enables more heat to be extracted.

Preferably, the heat sink comprises protrusions extending into the cavity. This enables the surface area of the inner skin in the cavity to be enlarged, to increase the amount of heat which can be transferred to the air in the cavity.

Preferably, the heat sink and the contact surface of the back wall of the rack are formed integrally as one piece. Among the advantages of this are that the thermal path can be improved, and construction made easier if there are fewer joints.

Preferably, the rack is removably attached to the rest of the enclosure, the heat sink fitting in an aperture in the inner skin. This can facilitate maintenance.

According to a second aspect of the invention there is provided a cabinet for outdoor use for enclosing electronics equipment, the cabinet comprising:
a double skin protective outer casing for enclosing the equipment, the casing comprising:
a lower air intake into a cavity between the skins of the double skin of the casing and an upper air output from the cavity to the outside, defining a path for unforced cooling air to flow, to extract heat from the equipment by convection; and
the inner of the skins comprising a fin extending into the cavity for promoting thermal transfer from the inner skin to the air in the cavity. An advantage arising is that the amount of heat which can be transferred to the air in the cavity can be increased because the surface area of the inner skin in the cavity is greater.

Preferably, the casing comprises a thermal insulation layer on the outer of the skins for insulating the equipment from solar radiation According to a third aspect of the invention there is provided a cabinet for outdoor use for enclosing a rack of electronics equipment, the cabinet comprising:
a double skin protective outer casing for enclosing the equipment, the casing comprising:
a thermal insulation layer for insulating the equipment from external conditions; and
a lower air intake into a cavity between the skins of the double skin of the casing and an upper air output from the cavity to the outside, defining a path for unforced cooling air to flow, to extract heat from the equipment by convection.

An advantage arising from the use of a layer of thermal insulation is that the deleterious effect of external heat sources such as solar radiation heating the cavity, can be reduced. This deleterious effect arises because the amount of heat extracted by unforced convection depends heavily on the temperature difference between the air in the cavity and the temperature of the inner of the skins, where the equipment heats this inner skin. A lower temperature of air flowing through the cavity can increase this temperature difference. Thus more heat can be extracted.

Preferably, a portion of the inner of the the skins of the double skin, comprises a heat sink of the rack of electronics equipment, and is provided with protrusions extending into the cavity. An advantage arising from this is that the thermal path from the rack to the cavity is improved and the protrusions increase the surface area in the cavity, and thus enable more heat to be transferred to the air in the cavity.

Preferably, the heat sink comprises a portion of a backplane of the rack. An advantage arising from this is that the thermal path from the electronics in the rack to the cavity can be improved, thus more heat can be transferred to the air in the cavity.

Preferably, the thermal insulation is provided on the inside of the outer skin of the double skin. An advantage of this is that the thermal insulation need not be weatherproof or vandal proof, or meet other requirements of the outer surface of the double skin.

According to another aspect of the invention there is provided a method of manufacturing a cabinet as set out above.

Any of the preferred features may be combined, and combined with any aspect of the invention, as would be apparent to a person skilled in the art.

To show, by way of example, how to put the invention into practice, embodiments will now be described in more detail, with reference to the accompanying drawings.

DETAILED DESCRIPTION

Figure 1:
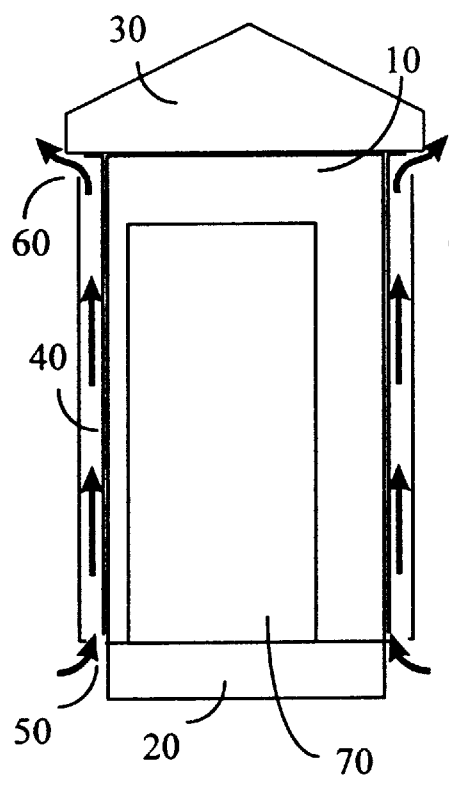
FIG. 1 shows a side on cross section view of a known double skin cabinet.
Figure 2:
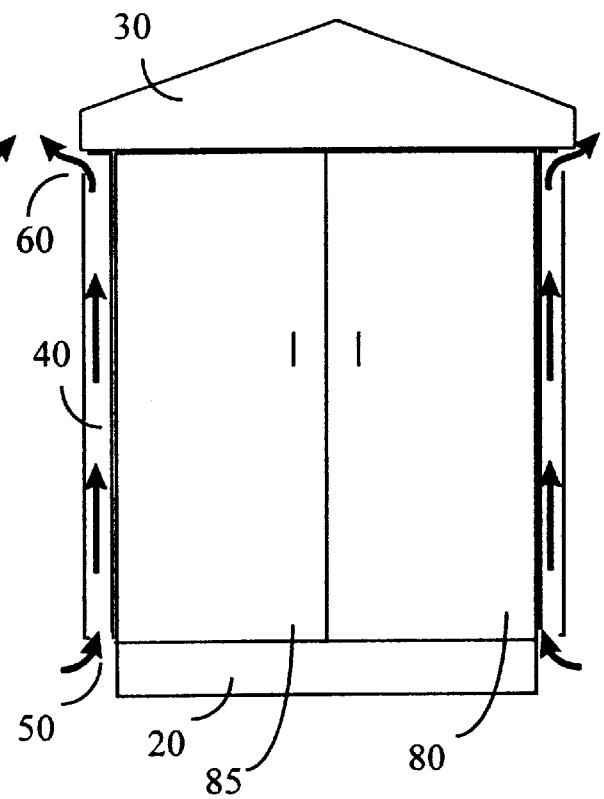
FIG. 2 shows a cross sectional back view of the known double skin cabinet of FIG. 1.

FIGS. 1, 2 Known Double Skin Cabinet

FIG. 1 shows a side on cross-section view of a known double-skinned cabinet. The cabinet may be rectangular in plan, with four walls enclosing a chamber 10 for housing the electronics equipment. The walls of the cabinet stand on a plinth 20, and a roof 30 is provided, which may be sloping, to shed water, and provide greater strength. The space within the roof may provide some insulation from solar radiation. A cavity 40 is provided between the skins of the double skin of the casing of the cabinet. A lower air intake 50, and an upper air output 60 are shown, to allow air flow in the direction of the arrows. An equipment rack 70 is provided within the chamber. This may be a stand alone rack or it may be fixed to structural elements such as bracing bars (not shown) in the chamber.

As shown, the cavity may provide convection cooling for the chamber, either unforced or forced. To provide forced air cooling, fans could be positioned near the upper air output 60, to draw cool external air through the cavity 40.

FIG. 2 shows a cross-sectional back view of the known double-skinned cabinet of FIG. 1. Reference numerals used in FIG. 1 show corresponding features in FIG. 2. The cabinet is illustrated without the rack 70. Hinged doors 80, 85 are shown to give access to the front of the chamber.

Figure 3:
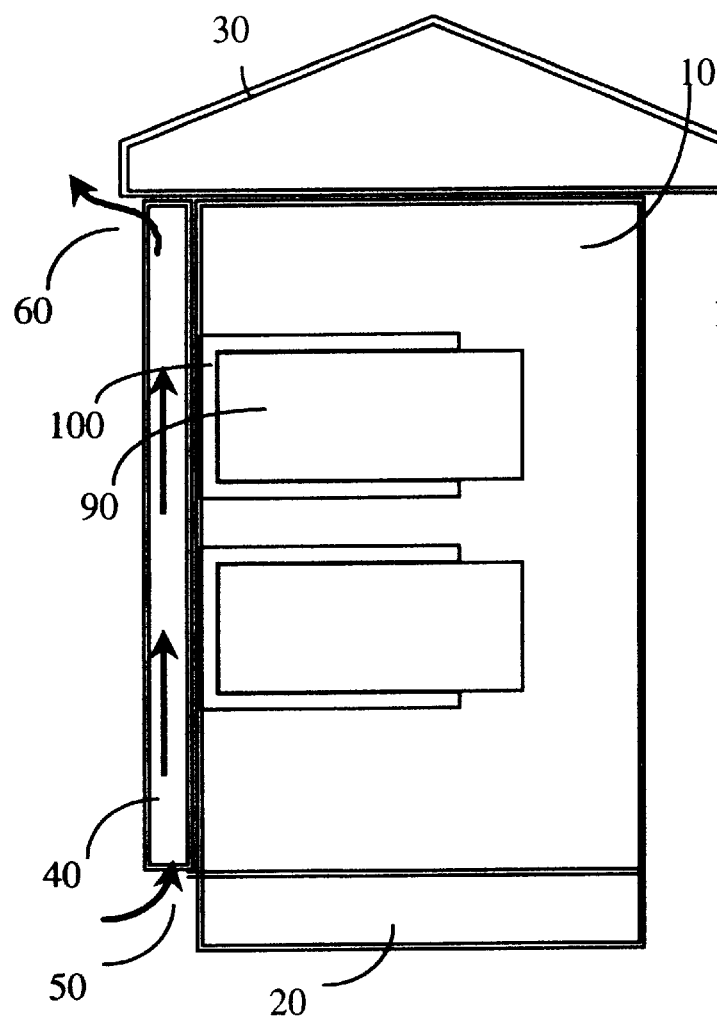
FIG. 3 shows a double skin cabinet in which the inner of the skins is formed in part by a heat sink of the rack, according to an embodiment of the invention.

FIG. 3, Double-skinned Cabinet with Inner Skin Formed by Heat Sink of the Rack

FIG. 3 shows a double-skinned cabinet according to a first embodiment of the invention. In this embodiment, a pair of card racks 100, containing cards 90, are shown within the chamber 10. They are mounted directly on the inner skin of the double skin casing such that a part at least of the inner skin forms a heat sink of the rack. There needs to be an effective thermal path from the electronics on the card in the rack, to the inner skin.

This may be achieved for example by making the rack of a thermally conductive material such as a metal casting. Suitable materials are well known. The skins of the casing could be constructed of a material such as steel to which a galvanized finish is applied to minimize corrosion. The material of the inner skin at least should be thermally conductive, to provide a good thermal path.

Preferably the rack is fixed to the inner skin in such a way that there is a maximum area of surface contact, to provide a good thermal path. For ease of maintenance, the rack may be bolted to the inner skin. A thermally conductive grease can be used to improve the thermal conduction across the joint. The fewer joints there are, the better the thermal path. Accordingly, the rack as illustrated may be formed as a one-piece casting. It would be possible to have it made in several parts if the joints are made to be thermally conductive.

It is conceivable that some heat generating circuit elements may be fixed directly to the rack, insulated where appropriate, according to known techniques. Other heat generating elements may be located on the circuit card 90, and a thermal path provided to the edge of the card, using metal strips, or the metallization printed on the circuit board.

As illustrated in FIG. 3, the double skin is provided on only one side of the cabinet, though as needed, other sides could also be provided with the double skin. Although no fans are shown, forced air could be provided in the cavity if required, and could be thermostatically controlled, to operate only when needed. Other fans could be provided within the chamber 10, to provide forced air cooling of particular components, for example.

The inner skin could provide structural support for mounting the racks, though it may be preferable to provide vertical mounting bars (not shown) to provide structural support to the racks, so that the inner skin can be made of thinner material. A typical mounting for the racks may be designed to support up to 100 kg per rack. The cabinet may be large enough to retain racks stacked on top of each other to extend over six feet in height, or may be sized to accommodate a single rack.

Figure 4:
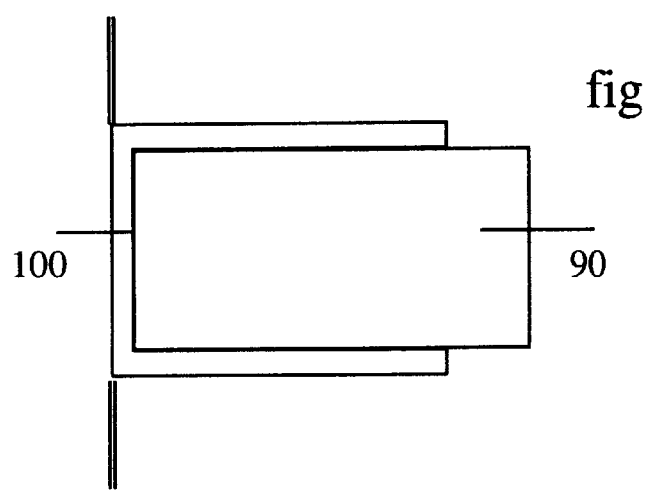
FIG. 4 shows another arrangement cabinet in which the inner of the skins is formed in part by a heat sink of the rack, where the heat sink and back wall of the rack are integral.
Figure 5:
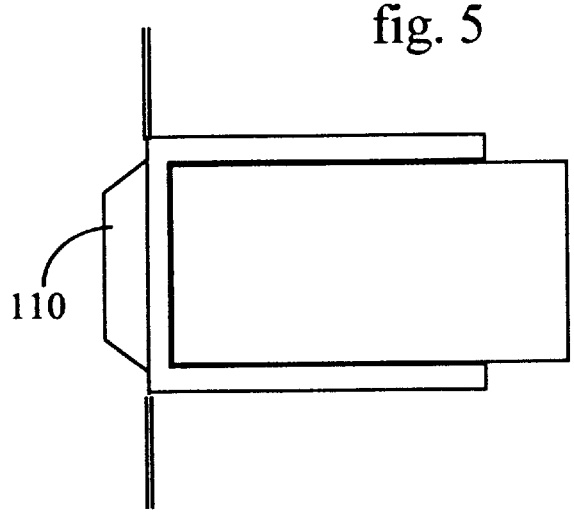
FIG. 5 shows the arrangement of FIG. 4 with fins.

FIGS. 4, 5 Integral Heat Sink and Back Wall of Rack

FIG. 4 shows in schematic form an arrangement according to another embodiment of the invention in which instead of the rack being attached to the inner skin, the back wall of the rack 100 forms part of the inner skin. This requires that the inner skin have an aperture corresponding in size and shape to the back wall of the rack. It enables the thermal path to be improved, since there is no longer a joint in the path at the contact surface between the inner skin and the back wall of the rack. However, some sort of seal may need to be provided, between the back wall and the surrounding parts of the inner skin, which may make manufacturing more difficult and expensive. The type of seal required would depend on the weather proofing and EMC specifications for the cabinet.

FIG. 5 shows a similar arrangement to that of FIG. 4, with the addition of a protrusion 110 in the form of a fin extending into the cavity, and oriented vertically. This serves to increase the surface area of the heat sink exposed in the cavity, and therefore increase the amount of heat which can be extracted by the air flowing in the cavity. Conceivably, the fins could be oriented diagonally if were desired to achieve an air flow away from the vertical, perhaps to enable the heat from a lower rack to avoid passing over the fins of an upper rack mounted immediately above the lower rack.

Figure 6:
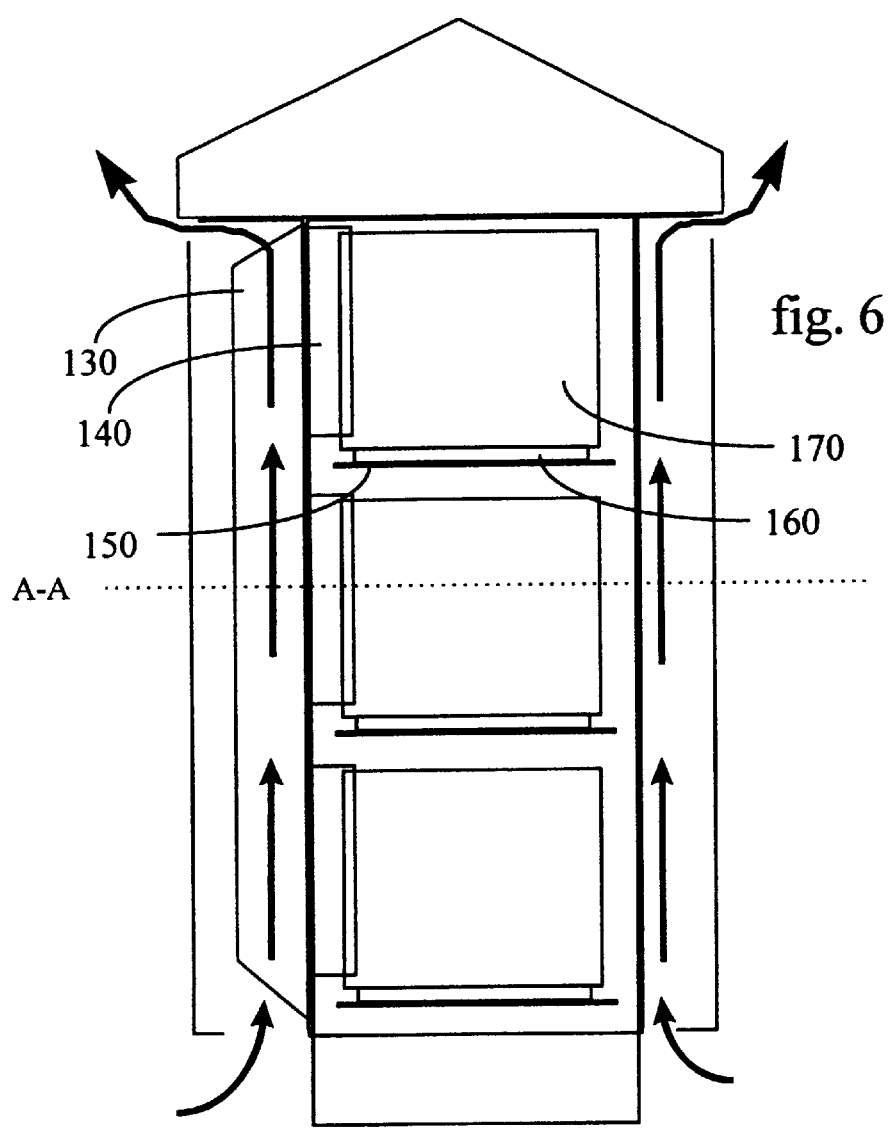
FIG. 6 shows a cabinet in which the back wall of the rack is used for thermal contacts and a backplane for signal connectors is located above the cards.
Figure 7:
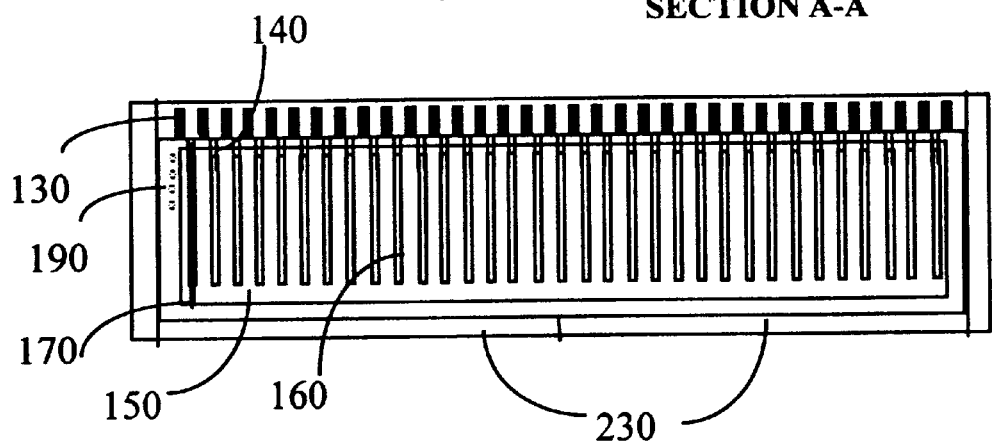
FIG. 7 shows a view in cross section A—A of FIG. 6.
Figure 8:
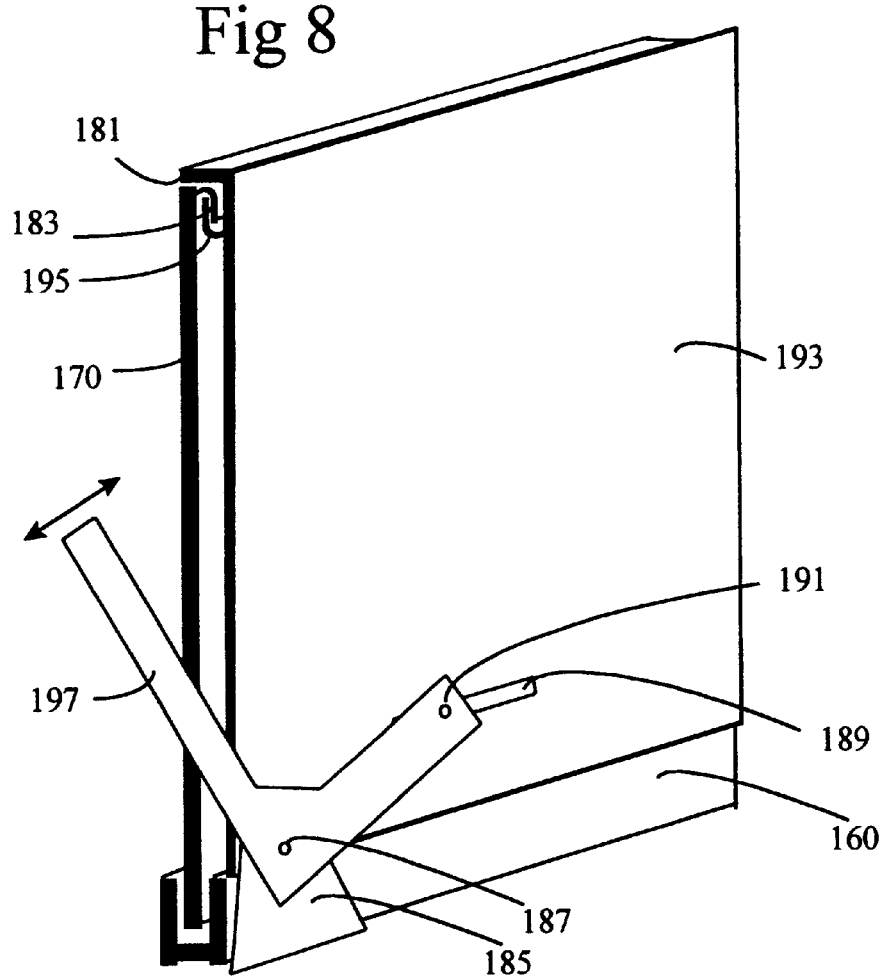
FIG. 8 shows a more detail of a mechanism for inserting cards into the rack of FIG. 6.

FIGS. 6,7,8 Back Wall of the Rack is Used for Thermal Contact, and Backplane is Located Away from the Back Wall FIG. 6 shows a cabinet according another embodiment of the invention, again in side view, and in cross-section, to show the interior of the chamber. The entire back wall of the rack is used for the thermal contact between the card and the rack. Interconnections between cards are enabled by a backplane with signal connectors, which is shown located below the cards in the rack.

The rack has a back wall 140 which forms a thermal contact, and a guide for substantially the entire length of one side of a circuit card 170. The rack also comprises a backplane 150 shown below the cards 170, though it could conceivably be mounted above the cards. Connectors 160 are mounted on the backplane, for coupling to corresponding connectors on the card 170. For the sake of clarity, structural members of the rack, for supporting the backplane, are not shown. Likewise, parts of the rack for guiding the tops of the card are not shown. Fins 130 in the cavity may be formed as part of the inner skin of the casing. Alternatively, the back wall 140 of the rack may be formed integrally with the fins 130, to form part of the inner skin, fitting in an aperture in the rest of the inner skin, in a manner corresponding to that shown in FIG. 4.

FIG. 7 shows a view in cross-section at A—A of FIG. 6. This is a plan view of the cabinet. It is illustrated with just one card 170 in the rack. Many fins 130 are shown. Many thermal contacts forming a back wall 140 are shown. The backplane 150 supports many connectors 160. Conductors 190 are illustrated at one end of the backplane, where such conductors are passed in or out of the rack.

The cabinet is shown with two doors 230 at the front. Double skinned sides are provided on all four sides of the cabinet.

To provide an integral heat sink and back wall of the rack, since many channels are required on both sides, it might be appropriate to form this as a one-piece aluminum extrusion. Other part of the rack could be formed separately.

To create a good thermal path from components on the circuit board 170, the heat generating components could be located close to the edge where thermal contact is made with the heat sink, and a large area of metallization could be provided between the components and the edge of the circuit board.

By providing a thermal contact along substantially the entire length of this edge of the card, the thermal path may be maximized. Preferably, the rack is arranged so that this edge is oriented vertically, so that the heat sink can conveniently be oriented vertically, to maximize natural convection.

FIG. 8 shows more details of a mechanism for inserting cards into the rack illustrated in FIGS. 6 and 7. Much of this mechanism is not shown in FIGS. 6 and 7 for the sake of clarity. The principal functions of the mechanism are as follows: it should allow cards to be inserted horizontally into the rack by hand; it should enable a user to move the inserted card vertically with sufficient force to insert the card into the connector, (the force should be directed evenly over the length of the connector, to ensure complete insertion over the entire length of the connector); it should enable the user to extract the card vertically from the connector; and extract the card horizontally from the rack. All this should preferably be achieved by a user who has access only to the front of the rack, (so that racks can be stacked and cards accessed while the racks are stacked).

An example of a preferred mechanism to achieve this is shown in FIG. 8 in a perspective view, in schematic form, to show the mechanical principles used. Actual dimensions are not necessarily illustrated to scale. The card 170, is fitted with a downward facing channel 183, extending along the top of one side of the card. A movable plate 193 is disposed alongside the card in the rack. The plate has an upwardly facing channel 195, at the top of the side facing the card. This channel can engage the channel on the card, to enable upward movement of the plate to cause the card to be extracted upwards out of its connector.

To enable the card to be forced downwards into the connector, a lip 181 is provided on the plate extending outwards over the channel on the card, and extending along the top of the plate. It is for engaging this channel, or the top edge of the card, when the plate is moved downwards. The plate can be moved downwards by means of a lever 197 pivoting at 187 on a pivot support 185 attached to the rack. An arrangement of a pin 191 sliding in a slot 189 enables the rotary movement of the lever to be converted into vertical movement of the plate.

If the lever rotates in a plane parallel to the card, it can be arranged so that an arm of the lever can be moved by a user at the front of the rack. An advantage of using a pair of cooperating channels, is that they can support the card as it is being inserted, and they provide a guide to assist sliding the card into the rack horizontally.

To install the circuit board the lever is pulled fully forwards, lifting the guide plate away from the connector. The guide channel on the circuit board is located into the corresponding channel on the guide plate and pushed fully home. The lever is then returned and locked in the vertical position, this action pushes the guide plate and hence the circuit board down, locating the board into the connector block.

Among the advantages of this arrangement are that the plate increases the thermal dissipation from the circuit board, reduces EMC interference between adjacent boards, and if made of metal, adds a fire barrier to the cabinet.

Figure 10:
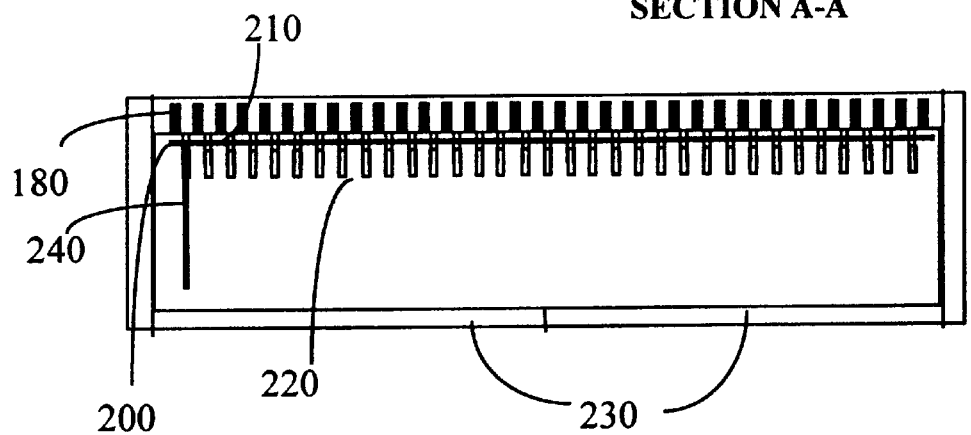
FIG. 10 shows a view in cross section A—A of FIG. 9.
Figure 9:
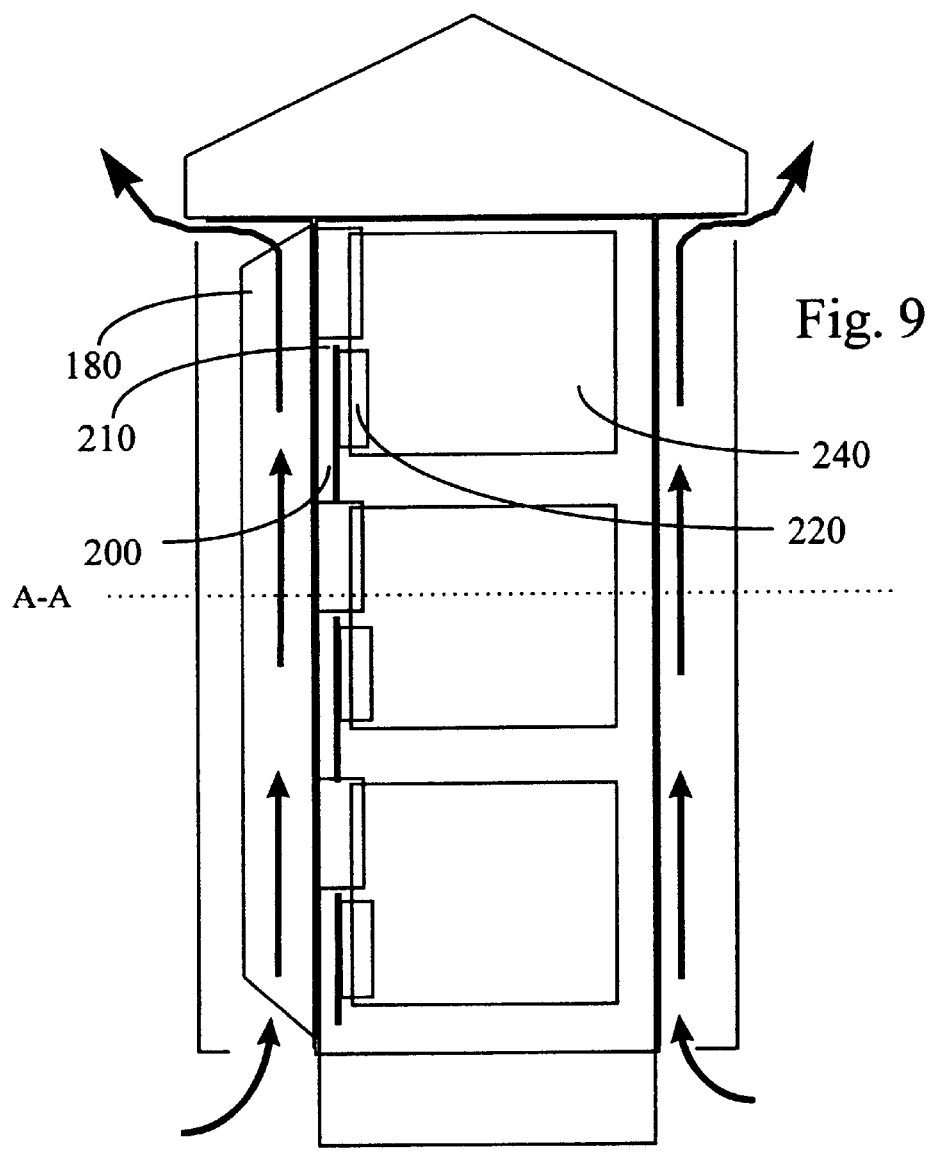
FIG. 9 shows a cabinet in which the back wall of the rack is shared by thermal contacts and signal connectors.

FIGS. 9,10—Back Wall Shared by Thermal Contacts and Backplane

FIG. 9 illustrates a further alternative embodiment of the invention, in which the back wall of the rack is shared by thermal contacts and signal connectors on a backplane. This reduces the area of thermal contact between the card and the back of the rack, since part of the back edge of the card is used for connectors. However, it enables construction to be simplified, since conventional horizontal insertion of the card can be used, obviating the need for a mechanism such as that shown in FIG. 8.

Fins 180, extending into the cavity, are connected to the back of the rack, formed by thermal contacts 210 and a backplane 200, itself comprising connectors 220. The card 240 is arranged to be inserted horizontally, using guides in the rack (not illustrated) above and below the card.

Again, the thermal contact at 210 at the back of the rack, could be formed integrally with the fins 180 forming part of the inner skin of the double-skinned casing of the cabinet.

Although as illustrated, approximately half the length of the back edge of the card 240 is devoted to thermal contact, and half to signal connectors, the proportions could be varied as appropriate. Furthermore, the connectors could be mounted on one side of the card, with thermal contact is made on the other side of the card, so that the entire length of the card could be used both for thermal contact and for connectors (not illustrated).

FIG. 10 shows a cross-section through A—A of FIG. 8. This is a plan view of the cabinet. It is shown with only one card, 240, inserted in the rack, and does not show card guides which may be provided in the rack above and below the card. This illustration is similar to that of FIG. 7, except that the connectors 220 and the backplane 200 now appear end-on, instead of face-on.

The thermal contacts 210 on the back wall of the rack form a channel for each card, receiving the back edge of the card, as it is inserted horizontally. The width of the channel for each card could be designed to be a parallel faced channel, wide enough to be a sliding fit. Thermally conductive grease could be used to ensure a good thermal path across the contact surfaces. Chamfered edges at the mouth of the channel would ease insertion.

The depth of the channels could be chosen to suit the design Deeper channels would enable a larger contact surface to be used, but might make insertion more difficult.

Conceivably, the sides of the channel for each thermal contact with the card could be spring loaded, to ensure good thermal contact, though this would increase manufacturing complexity and costs.

Figure 11:
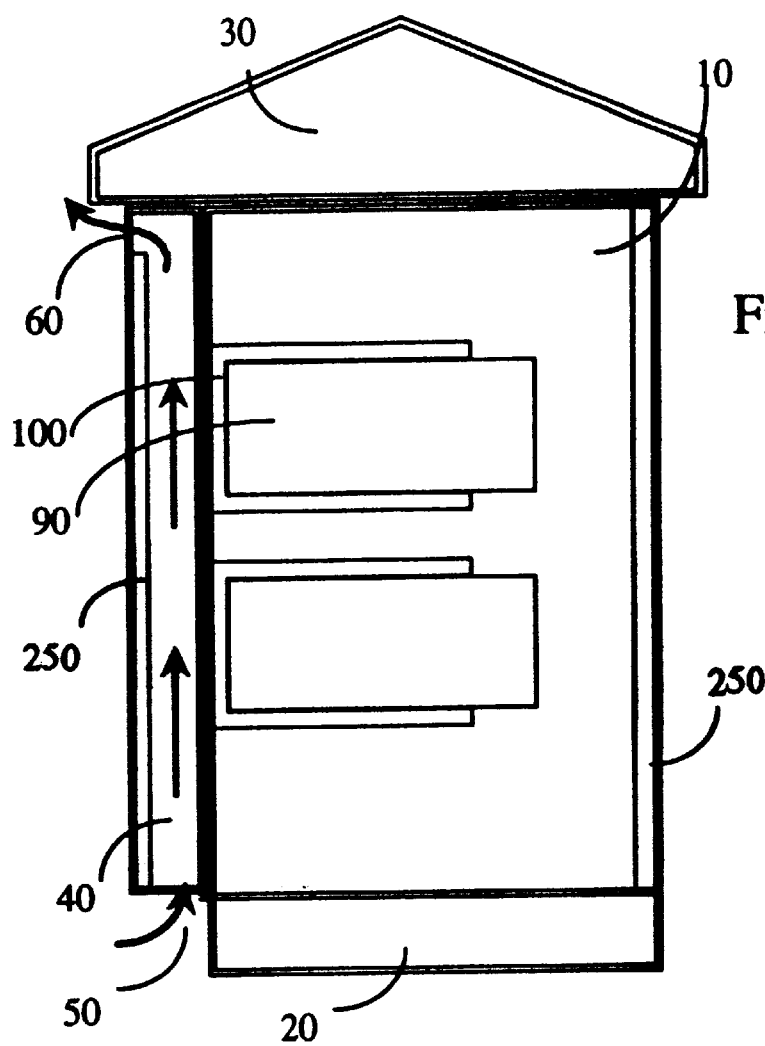
FIG. 11 shows an insulated double skin cabinet according to an embodiment of the invention.
Figure 12:
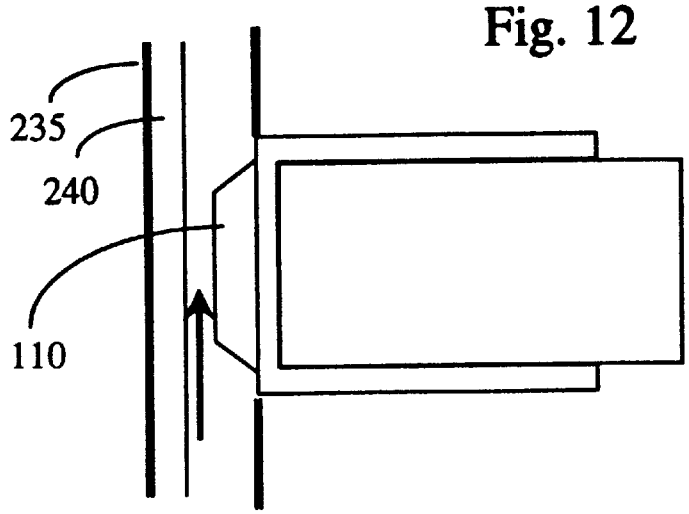
FIG. 12 shows an insulated double skin cabinet having fins in the cavity according to an embodiment of the invention.

FIGS. 11,12—Insulated Double-skinned Cabinet

FIG. 11 is similar to FIG. 3 except that a layer of insulation 250 is illustrated. This is provided on the inside of the outer skin of the double skin part of the casing. It may also be provided on the inside of single skinned parts of the casing, as illustrated at the right hand side of FIG. 11. Such insulation is preferably provided by spraying a foam such as a polyurethane onto the metal shell. Alternatively, layers of glasswool or polystyrene foam could be prefabricated and attached to the metal skin. One disadvantage of this alternative, is that there is a greater risk of the insulation becoming separated from the shell and blocking the air flow through the cavity. The thickness of the insulation layer could be chosen to suit the amount of solar radiation expected at the site. Furthermore, such insulation could be provided only on the sides which are exposed to solar radiation when the cabinet is installed. However this may increase production costs and installation would be more involved because each site would need to be surveyed, and the cabinet insulation made specific to the orientation at each site.

Such insulation could also be provided on the inside of the roof space (not illustrated). It would also be conceivable to integrate the insulation layer and the outer skin, if a sufficiently strong insulating material were to be used, such as a thick fiberglass type material.

FIG. 12 illustrates in more detail how the insulation layer 240 is provided on the inside surface of the outer skin 235. Sufficient room is left in the cavity for the fins 110. As illustrated, the fins do not bridge the cavity, and space is left for air to flow between the insulation layer and the fins. The structure could be made considerably stronger if the fins bridged the cavity, which might enable lighter, cheaper materials to be used, though the air flow might be impeded slightly, and there could be some thermal leakage of solar generated heat into the fins, which might begin to reduce the cooling ability of the arrangement.

Other Variations

Although the embodiments described above illustrate unforced cooling, it would be conceivable to include fans to provide additional forced air cooling, preferably controlled to maximise reliability. Although the embodiments described above illustrate using a plate next to the card for vertical insertion and extraction, according to an alternative embodiment, the plate and lever arrangement might be located above the card, so that the cards can be placed closer to each other. In this case, the channel on the plate would be on the bottom of the plate. This would bring the disadvantage of requiring a reduced height of card, or a higher rack. Instead of a lever arrangement, an alternative, not illustrated, would be to have a surface facing the top of the card, sloping down towards the back of the card, and a wedge between the card and the surface, pushed in by the user to force the card downwards.

For a single rack in the cabinet, it would be conceivable to dispense with an insertion mechanism, and leave the rack open at the top for manual insertion of cards in the vertical direction. Although in some of the embodiments described, the connectors are on the bottom of the rack, they could be provided on the top, with a corresponding mechanism to insert them.

Other variations as well as those discussed above will be apparent to persons of average skill in the art, within the scope of the claims, and are not intended to be excluded.

What is claimed is:

1. A cabinet for outdoor use for enclosing a rack of electronics equipment, the cabinet comprising:
    a double skin protective outer casing for enclosing the equipment, the casing comprising:
        an inner skin and an outer skin;
        a lower air intake into a cavity between the skins of the double skin of the casing and an upper air output from the cavity to the outside, defining a path for unforced cooling air to flow, to extract heat from the equipment by convection; and
        the inner of the skins being formed in part at least by a heat sink of the rack.

2. The cabinet of claim 1, wherein the heat sink forms at least part of a back wall of the rack, against which cards are inserted.

3. The cabinet of claim 1, wherein the cabinet further comprises the rack, and the heat sink shares a same wall of the rack as a backplane comprising connectors for connecting signals to the cards.

4. The cabinet of claim 1, having a back wall, and wherein the cabinet further comprises the rack, and the rack is arranged such that substantially the entire back wall forms the heat sink, the rack comprising:
    guides for guiding cards inserted into the rack along an insertion axis, normal to the back wall and enabling subsequent movement of the cards after insertion, along a connection axis, perpendicular to the insertion axis; and
    a backplane, comprising connectors for coupling to corresponding connectors on the cards, oriented perpendicular to the back wall and located to enable the coupling to take place by the subsequent movement of the cards along the connection axis.

5. The cabinet of claim 4, wherein the cabinet further comprises the rack, and the rack further comprises a mechanism for urging cards individually along the connection axis after insertion.

6. The cabinet of claim 4, the back wall further comprising:
    a thermally conductive contact surface for abutting a corresponding surface on one of the cards, extending along substantially an entire leading edge of each card, for making thermally conductive contact with a card inserted in the rack.

7. The cabinet of claim 6, the heat sink and the contact surface of the back wall of the rack being formed integrally as one piece.

8. The cabinet of claim 7, wherein the cabinet further comprises the rack, and the rack is removable, the heat sink fitting in an aperture in the inner skin.

9. The cabinet of claim 1, the heat sink comprising protrusions extending into the cavity.

10. A cabinet for outdoor use for enclosing electronics equipment, the cabinet comprising:
    a double skin protective outer casing for enclosing the equipment, the casing comprising:
        an inner skin and an outer skin;
        a lower air intake into a cavity between the skins of the double skin of the casing and an upper air output from the cavity to the outside, defining a path for unforced cooling air to flow, to extract heat from the equipment by convection; and
        the inner of the skins comprising a fin extending into the cavity for promoting thermal transfer from the inner skin to the air in the cavity.

11. The cabinet of claim 10, the casing comprising a thermal insulation layer on the outer of the skins for insulating the equipment from solar radiation.

12. A cabinet for outdoor use for enclosing a rack of electronics equipment, the cabinet comprising:
    a double skin protective outer casing for enclosing the equipment, the casing comprising:
        an inner skin and an outer skin;
        a thermal insulation layer for insulating the equipment from external conditions; and
        a lower air intake into a cavity between the skins of the double skin of the casing and an upper air output from the cavity to the outside, defining a path for unforced cooling air to flow, to extract heat from the equipment by convection,
        the inner of the skins of the double skin comprising a heat sink of the rack of electronics equipment, and being provided with protrusions extending into the cavity.

13. The cabinet of claim 12 the heat sink comprising a portion of a backplane of the rack.

14. The cabinet of claim 12, the thermal insulation being provided on the inside of an outer skin of the double skin.

15. A method of manufacturing a cabinet for outdoor use for enclosing a rack of electronics equipment, comprising the steps of:

making a double skin protective outer casing comprising an inner skin and outer skin for enclosing the equipment, by:

making a lower air intake into a cavity between the skins of the double skin of the casing and an upper air output from the cavity to the outside, defining a path for unforced cooling air to flow to extract heat from the equipment by convection; and forming the inner of the skins in part at least from a heat sink of the rack.

\* \* \* \* \*